United States Patent [19]
Tsai et al.

[11] Patent Number: 5,260,141
[45] Date of Patent: Nov. 9, 1993

[54] DIAMOND COATED PRODUCTS

[75] Inventors: Chung-hsien Tsai, Minneapolis; John C. Nelson, Maplewood; Joachim V. R. Heberlein, North Oaks; Emil Pfender, West St. Paul; William W. Gerberich, Shorewood, all of Minn.

[73] Assignee: Regents of the University of Minnesota, Minneapolis, Minn.

[21] Appl. No.: 800,408

[22] Filed: Nov. 29, 1991

[51] Int. Cl.$^5$ ............................................. C23C 16/26
[52] U.S. Cl. ...................................... 428/634; 428/614; 428/679; 427/577; 427/249
[58] Field of Search ............... 428/634, 679, 614; 51/309; 57/401, 337, 414; 427/577, 249

[56] References Cited

U.S. PATENT DOCUMENTS

| | | | |
|---|---|---|---|
| 2,292,991 | 8/1942 | Crompton, Jr. | 428/614 |
| 2,343,957 | 3/1944 | Crompton, Jr. | 428/614 |
| 2,411,867 | 12/1946 | Brenner | 428/634 |
| 2,571,772 | 10/1951 | Simons | 51/309 |
| 2,858,256 | 10/1958 | Fahnoe et al. | 51/309 |
| 3,295,941 | 1/1967 | Spellman | 428/614 |
| 3,894,673 | 7/1975 | Lowder et al. | 51/309 |
| 4,333,307 | 6/1982 | Schuster et al. | 57/337 |
| 4,358,922 | 11/1982 | Feldstein | 428/634 |
| 4,919,974 | 4/1990 | McCune et al. | 427/249 |
| 4,988,421 | 1/1991 | Drawl et al. | 427/249 |
| 5,032,568 | 7/1991 | Lau et al. | 505/1 |

FOREIGN PATENT DOCUMENTS

| | | |
|---|---|---|
| 0378378 | 7/1990 | European Pat. Off. |
| 0411298 | 2/1991 | European Pat. Off. |
| 0444824 | 9/1991 | European Pat. Off. |
| 0449025 | 10/1991 | European Pat. Off. |
| 0469204 | 2/1992 | European Pat. Off. |
| 60-201878 | 10/1985 | Japan |
| 3-215393 | 1/1990 | Japan |
| 778811 | 7/1957 | United Kingdom ............... 51/309 |
| 2197335 | 5/1988 | United Kingdom ............... 51/309 |
| WO90/10725 | 9/1990 | World Int. Prop. O. |

OTHER PUBLICATIONS

Derjaguin B. V. et al., "The Synthesis of Diamond at Low Pressure" *Sci. American*, vol. 233(5) pp. 102–109 (1975).
Sarkar A. D., "Friction and Wear" *Academic Press* pp. 2 and 4 (1980).
Budinski K. G., *Engineering Applications of Ceramics*, pp. 128–139 (1983).
Budinski, K. G., *Engineering Materials*, pp. 227–253 (1983).
Spear, "Diamond-Ceramic Coating of the Future" *J. Am. Ceram. Soc.* vol. 72[2] p. 171 and pp. 184–187 (Feb. 1989).
Deshpandey C. V., "Diamond and diamondlike films: Deposition processes and properties", *J. Vac. Technol.* A7(3), pp. 2294–2302 (May/Jun. 1989).
Yarbrough W. A. et al., "Current Issues and Problems in the Chemical Vapor Deposition of Diamond" *Science* vol. 247, pp. 688–296 (Feb. 1990).
Levin et al., "Solid-State Bonding of Diamond to Nichrome and Co-20 wt % W Alloys" *Journal of Materials Science Letters* vol. 9 (1990) pp. 726–730.
Wu T. W., "Microscratch and load relaxation tests for ultra-thin films" *J. Mater. Res.*, vol. 6, No. 2, pp. 407–426 (Feb. 1991).
Collie M. J., "Industrial Abrasive Materials and Compositions", pp. 75–83, 1981.

*Primary Examiner*—Michael Lewis
*Assistant Examiner*—N. M. Nguyen
*Attorney, Agent, or Firm*—Merchant, Gould, Smith, Edell, Welter & Schmidt

[57] ABSTRACT

A method is provided for preparing a diamond coating on a substrate. The method includes a first step of applying a partial diamond coating having an effective amount of void area therein to the work surface of a substrate. In a follow-up step the void area in the partial coating is filled with binder, preferably metallic binder. In a later step, diamond projecting outwardly from the binder is further grown, to generate a covering portion or a head portion extending over, and in protective relationship with, the binder or binder material. According to the present invention preferred products are also provided.

8 Claims, 5 Drawing Sheets

DIAMOND COATED PRODUCTS

GOVERNMENT SUPPORT

This invention was made with government support under contract nos. ECD 8721545 and CDR 8721551 by the National Science Foundation. The government has certain rights in the invention.

FIELD OF THE INVENTION

The present invention relates to diamond coated products and methods of preparation. It particularly concerns products in which a diamond coating is set in both a substrate and a binder. A preferred multistep process is provided which involves two stages of diamond film or coating growth, with an intermediate stage of binder or filler application.

BACKGROUND OF THE INVENTION

Because of the various physical and chemical properties of diamond, diamond coatings have great potential for utilization in a wide variety of industries. In particular, diamond has a very high thermal conductivity and a very low electrical conductivity. It is very hard, inert and chemically resistant. Thus, it is a particularly effective protective coating for the wear or work surfaces of items such as cutting tools, drills or bearings; and, it is an effective protective coating for example for medical or surgical instruments or implants etc. In Spear, "*Diamond-Ceramic Coating of the Future*", Journal of the American Ceramics Society, Vol. 72, No. 2 (Feb. 1989), pages 184-187 incorporated herein by reference, desirable properties and applications of diamond coatings are described in considerable detail.

Diamond coatings have been applied in a wide variety of manners. One of the older and best known methods of creating a diamond coating is through a sintered carbide process. While a great many variations in such processing are known, a typical examples of such processing are provided in the descriptions in Levin, E, et al, "Solid State Bonding of Diamond to Nichrome and Co. - 20% wt W. Alloys", *J. Mater. Sci. Lett.;* Vol. 9 (1990) p. 726; and, Budinski, K.G., *Engineering Materials*, p. 128-132, both of which are incorporated herein by reference.

In general, a carbide sintering process for preparation of diamond coating concerns provision of powdered carbide of appropriate size (typically about 1-100 microns). The carbide is sintered with a binder onto a substrate under conditions of high pressure and temperature. Typically the binders are metal binders such as nickel or chromium. Typical substrates are steel, ceramics or similar materials. Typical conditions for application to the substrate are about 3.0 GPa pressure and 25° to 1,300° C.

While such processes have been effectively utilized to provide diamond coated substrates, there are some characteristics of the process, and products resulting from the process, which are less than preferable, but which generally result if the process is followed.

For example, products made by a sintering process comprise substrates with a diamond coating that has regions of exposed binder between diamond particles. While diamond is very hard, inert, and resistant to both chemical and physical deterioration, typical binders do not possess such characteristics (at least to the extent of diamond). Thus, the binder represents a site at which corrosion or other attack on the coating can take place, limiting the coating lifetime and increasing likelihood of failure. Also, the binder may not possess the desireable insulation properties associated with diamond.

If the coating is of a substrate that is to be utilized under conditions of extreme wear or pressure, such as in a cutting tool, drill bit or bearing, problems with wear over the lifetime of such coatings can arise from the fact that in general the regions of binder between the diamond particles represent relatively soft material subject to contact wear at a relatively high rate, by comparison to the diamond particles themselves. That is, binder is undesirable with respect to wear.

Another characteristic of diamond coatings formed from sintered diamond particles with binder is that there tends to be a relatively wide range (1-100 microns) of diamond particle sizes present in the diamond powder utilized for the formation of such coatings. Under the stresses to which coated articles are placed during use, different particle sizes will tend to be affected in different manners. Thus, uneven wear in the diamond coating can result. In addition, uneven action (grinding, cutting, etc.) as a result of the different particle sizes may occur.

As alternatives to sintering processes, chemical vapor deposition (CVD) techniques have been developed for preparing diamond coatings. A variety of such techniques have been reported. In general they concern heating a mixture of hydrogen and methane to a sufficient temperature to achieve a desired disassociation into hydrogen atoms and fragments of organic material. From the highly excited mixture, a deposition of diamond can be obtained, onto a cooler substrate surface. In one reported method, a diamond coating is provided by means of a chemical vapor deposition by passage of hydrogen and methane over a heated tungsten filament. In certain other methods, a nonequilibrium, low pressure plasma plume or stream is generated from hydrogen gas and methane, with the deposition occurring from the plasma plume. See Derjaguin, B. V. et al, "The Synthesis of Diamond at Low Pressure", SciAm., 233(5), p. 102-109 (1975), incorporated herein by reference.

From a typical chemical vapor deposition, the resulting diamond coating is joined to or in communication with the substrate. This provides a relatively rigid diamond coating, somewhat more susceptible to damage from stresses of thermal shock or physical shock in use, than a coating made according to the previously described sintering process. A reason for this is that the binder, which is between the diamond particles in a sintered film, can absorb (or dampen) both thermal and physical shock.

A characteristic feature of many reported chemical vapor deposition procedures used for the preparation of diamond coatings, is that they are relatively slow. For example, typically the diamond is deposited at rates on the order of about 0.1 microns per hour from a tungsten filament process. If a diamond coating on the order of about 5-20 microns thick is desired, relatively long deposition times are contemplated. Thus the technique is relatively expensive and inconvenient. For a general discussion of conventional CVD processes see Yarbrough, W.A. et al, "Current Issues and Problems in the Chemical Vapor Deposition of Diamond", *Science*, Vol. 247, p. 688-696 (Feb. 1990), incorporated herein by reference.

In addition, while the diamond coating being prepared is relatively stable to the high temperature conditions of the process, the substrate may not be. Under exposure to relatively high temperatures for extended lengths of time, redistribution in the substrate, resulting in unwanted phases or properties at the interfaces, may occur. That is, the substrate may become "over tempered." To accommodate for this, in some systems chemical vapor deposition has been applied to tungsten carbide substrates which, although relatively expensive, are quite heat stable. When it is desired to apply a diamond coating to less expensive "tool steel", a deposition rate of about 0.1 microns per hour is sufficiently slow to ensure that over tempering of the substrate will occur in many instances, resulting in undesired potential in the substrate for flaw or failure.

As indicated above, chemical vapor deposition techniques have been developed wherein nonequilibrium, low pressure, plasma is generated from the hydrogen and carbon feed-stock, with the deposition occurring from the plasma flame or stream. Typically such low pressure processes are operated with a plasma stream pressure on the order of about $10^{-2}$ Torr to about 10 Torr. Under such relatively low pressures, the electrons in the plasma stream are quite hot, by comparison to the carbon or organic fragments therein.

Such techniques (deposition from nonequilibrium, low pressure plasma) have been used to apply coatings at deposition rates on the order of about 1-5 microns per hour. Thus, they are relatively rapid by comparison to the tungsten filament vapor deposition technique. Such rates are undesirably slow, however, for utilization to apply relatively thick coatings (at least about 15 $\mu$m) on tool steel substrates and the like, wherein tempering usually occurs at a rate of about 2.5 cm of depth per hour.

A variety of techniques have been utilized to generate the plasma streams for such chemical vapor depositions. These include microwave generation, RF glow discharge, and DC glow discharge.

SUMMARY OF THE INVENTION

According to the present invention a method is provided for preparing a diamond coating and preferred products resulting from the process are provided. The method generally includes a first step of applying a partial diamond coating having an effective amount of uncovered or "void area" therein to a work surface of a substrate. By "effective amount" in this context, it is meant an amount effective to provide a product with desired characteristics; i.e. able to receive sufficient filler in the second step for advantage in final product to result. Generally, a void area of at least about 5% and preferably about 5% to about 30% is preferred.

Methods according to the present invention include a second step of filling (covering) the void area in the partial diamond coating with binder. In certain preferred applications a metallic binder is used. In preferred applications, the partial diamond coating will be provided with an overall average thickness of about 5-20 microns (more preferably about 10-15 microns), and the binder will be applied to the void area in a depth of about 10% to about 80% of the thickness of the partial diamond coating.

Methods according to the present invention include a third step of growing or applying further diamond coating over the binder, in covering relation with respect thereto. Preferably the further applied diamond is grown until the diamond particles coalesce to form a continuous film. Typically, this occurs after growth to a thickness above the binder of at least about 10-15 microns.

In preferred processes according to the present invention, the first step of applying a partial diamond coating comprises a step of chemical vapor deposition of diamond from a plasma plume, preferably a thermal plasma plume. Also, preferably the step of filling the void area with binder comprises a step of electrodeposition of binder into the void volume. The final step of diamond coating over the binder preferably comprises regrowth of the diamond crystals in the partial coating through a further chemical vapor deposition, again most preferably from a thermal plasma plume. A particular advantage to conduction of the third step in this manner is that some infusion or interdiffusion between the substrate and binder can occur, leading to a well secured film.

In certain preferred applications, the substrate provided for application of the process is tool steel. Processes according to the present invention are preferred for such applications at least in part since tool steel substrates with diamond coatings thereon can be readily prepared with less problem with over tempering, due to the high deposition rates (and short exposure times) that can be achieved. Herein the term "tool steel" in this context is meant to refer to carbon or alloy steels capable of being hardened and tempered; see Budinski, K.G., *Engineering Materials*, p. 227, Reston, Va. (1983), incorporated herein by reference.

Also, according to the present invention diamond coated products are provided. The diamond coated products comprise a substrate having a work surface thereon. The products include a diamond coating positioned on the substrate work surface. The diamond coating comprises diamond crystal material having base portions (or roots) in communication with (touching) the substrate work surface. At the point of contact with the substrate, a layer of chemical bonding between the diamond material and the substrate is observed. The diamond crystal material base portions have spaces therebetween which, if made according to the method described above comprise the recited "void area". The characterization that the base portions have "spaces therebetween" is not meant to suggest that each and every base portion is completely separated and does not touch other base portions, but rather that the base portions do include some space therearound into which binder material can be positioned.

Products according to the present invention include binder material in the spaces between the diamond crystal material root portions. The binder material has a "outer surface", comprising the surface of the binder material space from or directed away from the substrate. The diamond crystal material includes a head portion which extends over and in covering relation with the binder material outer surface. At the point of contact between the binder and the substrate, some infusion or interdiffusion may occur.

Thus, the product may be characterized as comprising a diamond coating having base projections which extend through binder material and to the substrate. The coating has a head positioned over the binder material, and thus protects the binder material from attack or wear. The binder material, positioned underneath the outer diamond surface and spacing the diamond base projections, provides for advantageous absorption of thermal and physical shock. Preferably, the binder material comprises a metallic binder or alloy.

In certain preferred products, the binder material will be about 3-15 microns thick and the diamond material head portion, i.e. that portion of the diamond material extending above the depth of the binder, will be about 2-7 microns thick, although it is foreseen that a variety of specific designs will be useful.

Preferred methods for applying diamond coating according to the present invention involve chemical vapor deposition from thermal plasma plumes wherein the plasma plumes are generated by RF induction discharge or DC arc discharge. Preferably the substrates are cooled during the deposition process, to inhibit over tempering or overheating. Specific methods and apparatus useable to accomplish this are described herein below.

BRIEF DESCRIPTION OF THE DRAWINGS

In certain of the following sketches, relative material thickness and component sizes may be shown exaggerated, to facilitate understanding.

DETAILED DESCRIPTION OF THE INVENTION

As required detailed embodiments of the present invention are described herein. The descriptions are intended to be exemplary of techniques and constructions according to the present invention. The invention may be applied in a variety of alternate manners and applications.

The General Process

Figure 1:
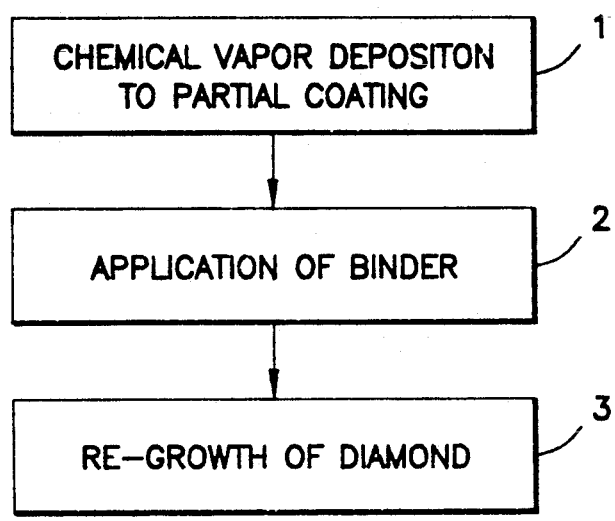
FIG. 1 is a schematic flowchart, showing general steps conducted in preferred processes according to the present invention.

In FIG. 1 a schematic drawing is provided, which illustrates generally a preferred process for production of preferred diamond coated substrates according to the present invention. The process may be generally characterized as involving three phases, stages or steps. In the first stage, indicated generally at reference number 1, a chemical vapor deposition technique is applied to achieve a partial coating of diamond on a substrate. By "partial coating" in this context, it is meant that the deposition is practiced until the substrate includes a substantial amount of diamond crystals on the surface thereof to be coated, but an effective amount of substrate work surface remains uncoated with diamond to achieve the desirable effects provided by later steps or phases. That is, there are spaces or voids between diamond crystals on the substrate (although some and indeed crystals may touch). Alternately stated, some preferred % of work surface is left partially exposed. Typically the first phase of deposition should be controlled such that diamond crystals occupy no greater than about 95% of the surface area of the substrate to be coated, the remaining at least 5% comprising uncoated substrate surface area.

Herein, that region of the substrate surface which is to be coated will be referred to as the "work surface", "deposition region", or "coating region" of the substrate. Within the "work surface", the "uncoated surface area" of the substrate after the first stage of the method, will be referred to as the "void area" or "void volume". For example a coating having "void area" of about 5% is a coating having the diamond crystals occupying or covering about 95% of the substrate work surface, the remaining 5% not having diamond thereon. In a typical application, the "void area" will be randomly distributed throughout the work surface, after the first phase. It is foreseen that in typical applications the first phase will be conducted such that the "void area" is at least about 5%, and will typically be about 5-30% (preferably about 10-20%). The preferred amount of void area may vary, for example depending upon the coating desired and the application to which the coated substrate is to be placed. Control of the amount of void area is generally achieved through the control of the conditions of deposition. In particular, the deposition is stopped short of the most complete coverage obtainable, at some preferred % of work area coverage. Further description with respect to this is provided herein below.

In the second phase the void area is filled or covered with binder (filler). That is, binder is applied to that portion of the substrate work surface to fill in the coating region not already occupied by the diamond particles. Specific preferred binders and methods for their application, are described herein below. In general the binder will be selected from a material which is relatively soft and tough, by comparison to diamond particles. Thus the binder material will not only help area or secure the diamond particles in place, but it will also act as a thermal shock absorber and/or physical shock absorber in the coating, between the diamond particles. In addition, the use of a metal binder with a relatively high thermal expansion coefficient may put the diamond crystals into compression upon heating, increasing their fracture and chipping resistance for abrasion and wear applications.

In the third phase of the process, indicated generally at reference numeral 3, the substrate with diamond particles and exposed binder is subjected to further growth of the diamond crystals typically at least until substantially complete overgrowth of the previously exposed binder has occurred. Generally, the regrowth is conducted until a diamond coating of appropriate and desired thickness is obtained. Typically, a thickness of at least about 10 microns above the binder will be preferred for many applications.

Figure 2:
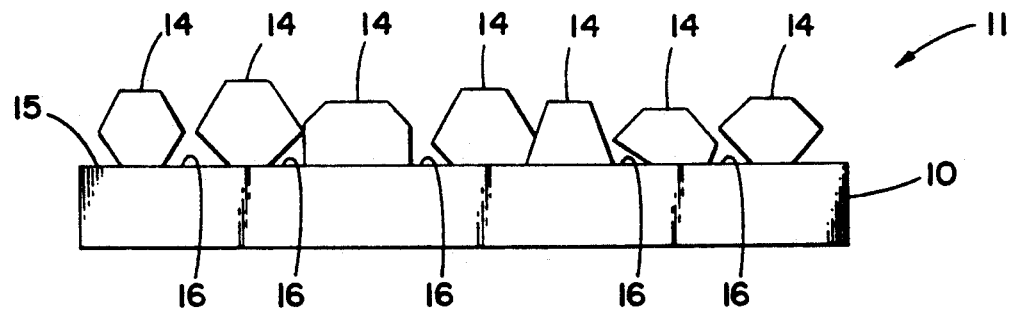
FIG. 2 is a schematic representation of a diamond coating on a substrate exemplified after the first step or phase of processing illustrated in FIG. 1.
Figure 3:
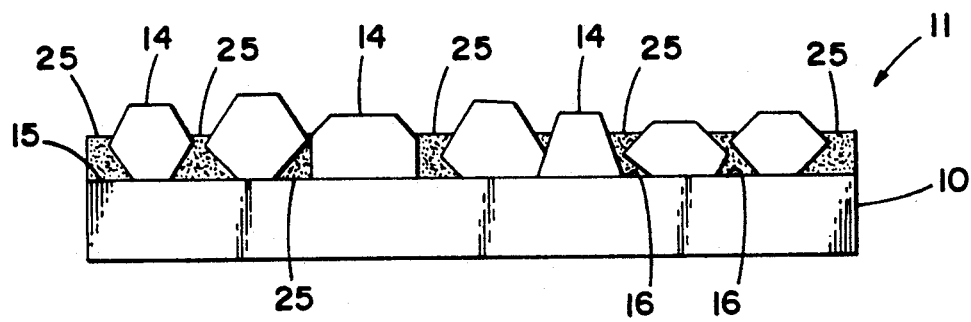
FIG. 3 is a schematic representation of a substrate with a diamond coating thereon illustrated after a second step or phase of operation according to the process shown in FIG. 1.
Figure 4:
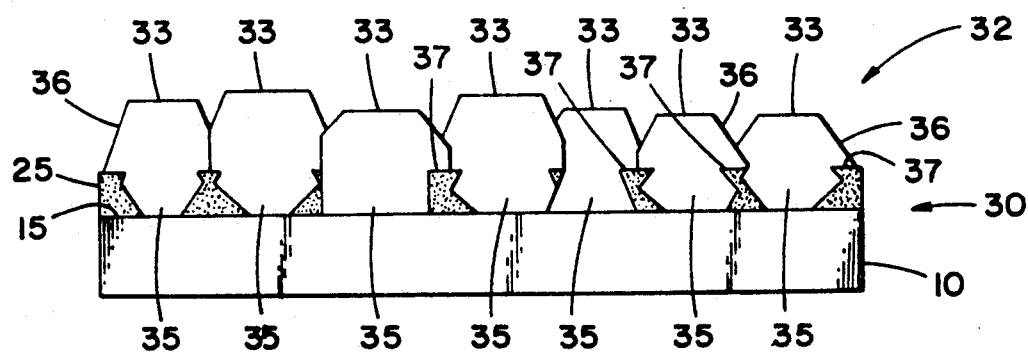
FIG. 4 is a substrate having a diamond coating thereon according to the present invention, illustrated after the process of FIG. 1 has been completed.

The process will be further understood by reference to FIGS. 2, 3, and 4, which schematically represent the substrate after each stage or phase. In addition, the electron micrographs of FIGS. 5 and 6 reflect actual samples made according to the techniques of the present invention.

In FIG. 2, a schematic representation is provided of the substrate after phase 1 operation. The schematic of FIG. 2 is shown viewed from side elevation. Referring to FIG. 2, the substrate 10 is depicted having a partial coating 11 of diamond particles thereon. In the schematic of FIG. 2, and related schematics, the relative material thickness are exaggerated.

Diamond coating 11 is a "partial coating" according to the above description, comprising a plurality of diamond particles 14 applied on work surface 15 of the substrate 10. While some of the particles 14 may touch one another, void area or space not occupied by, or covered by diamond particle, is provided in between diamond, as for example as illustrated at regions 16. Although not illustrated in FIG. 2, when preferred techniques of the present invention are applied utilizing chemical vapor deposition methods for creation of coating 11, particles 14 may be chemically bonded with substrate 10 somewhat. This secures the diamond particles 14 to the substrate 10.

Herein the construction resulting after phase 1 of FIG. 1, illustrated in schematic of FIG. 2, may be referred to as the "phase 1 substrate or product", or in the alternative as a "diamond/substrate product with void area."

In FIG. 3, a schematic is presented of the substrate/coating after the completion of stage or phase 2, i.e., after the application of binder (filler) to fill or occupy the void space. Referring to FIG. 3, the substrate 10 is depicted with coating 11 on surface 15 thereof; coating 11 comprising diamond particles 14 with spaces 16 therebetween. In FIG. 3, as a result of application of binder, areas 16 are occupied by binder 25.

Referring to FIG. 3, the arrangement depicted therein is shown with binder 25 fully covering void areas or regions 16. In this context the phrases "fully covering", "fully filling" and synonyms or variants thereof, in reference to the void area, are meant to refer to the extent of coverage of work surface 15 of the substrate 10. It is not meant to be indicated by this and similar terms how "deep" the layer of binder 25 is, relative to the diamond particles 14. This depth is described and referenced in different terms, provided herein below.

Figure 5:
FIG. 5 is a scanning electron micrograph depicting a diamond coating generally corresponding to that shown schematically in FIG. 3.

In FIG. 5, an electron micrograph is shown depicting a product after stage 2 and as illustrated in FIG. 3, i.e. after completion of phase or stage 2 of FIG. 1. Details of the experiments resulting in products as depicted in the electron micrograph of FIG. 5 are provided hereinbelow. In general, by FIG. 5 one can view a plurality of diamond particles, embedded with binder therebetween. The binder of FIG. 5 comprises a nickel coating, applied to the substrate by means of electroplating. In FIG. 5, the white bar in the bottom right hand side of the electron micrograph provides the scale for a 10 micron distance in the depiction. This is indicated by the designation "10 μm" written underneath the white bar.

In FIG. 5, a relatively large diamond particle is shown in the approximate right center of the micrograph, with a portion thereof fragmented or chipped. This resulted from a scratch test, described hereinbelow in detail.

Referring now to FIG. 4, a schematic is provided illustrating an arrangement 30 resulting from the process of phase or stage 3, FIG. 1. Arrangement 30 comprises substrate 10 having surface 15 provided with diamond coating 32 thereon. Coating 32 represents coating 11, FIG. 3, expanded or extended by regrowth or further growth of the diamond particles thereon, to result in particles 33. As a result of the regrowth to yield particles 33, diamond coating 32 extends over and in covering relation with binder 25. (Thus, each of particles 33 includes a base portion 35 embedded within the binder 25 and in communication or touching for example bonded with substrate 10.) Each of particles 33 also includes a "head portion" 36 which projects outwardly from binder 25 and in extension thereover. That is head portion 36 comprises a head of diamond material extending over outer surface 37 of binder 25.

Figure 6:
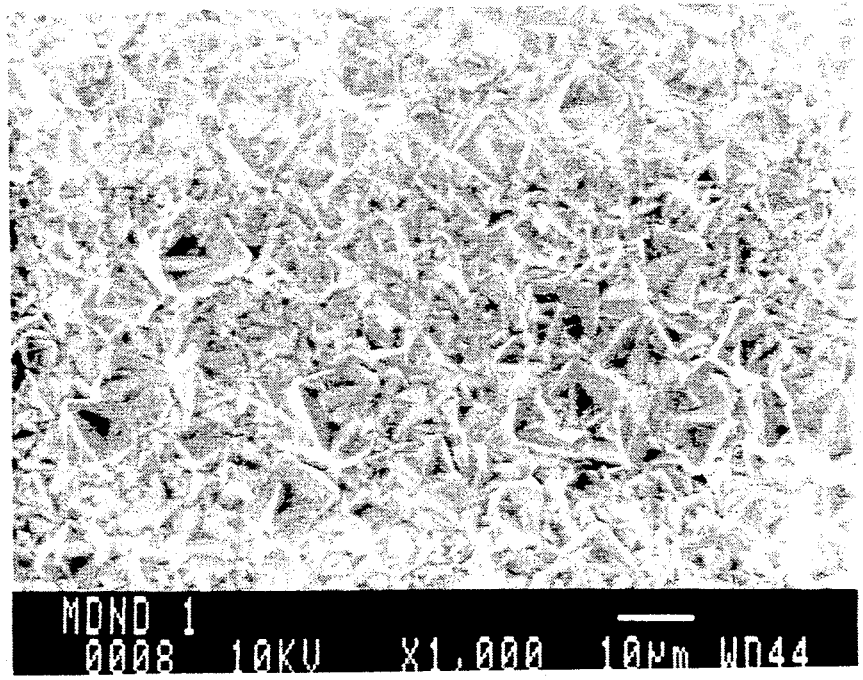
FIG. 6 is a scanning electron micrograph depicting a diamond coating generally corresponding to the schematic of FIG. 4.

Attention is now directed to the electron micrograph depicted in FIG. 6, which shows the product resulting after stage 3. A continuous diamond coating is depicted, with substantially no void area or exposed binder. Specific conditions which can be used to provide products such as would exhibit the micrograph of FIG. 6 are provided hereinbelow in detail. Reference is made to the white bar in the lower right hand corner of FIG. 6, which provides a scale for a 10 micron distance.

Preferred Methods and Conditions for Conduct of the Process

Hereinabove, general descriptions of the processes conducted in each of the three phases reflected in FIG. 1, were provided. In addition, depictions of the resulting products from the stages were indicated schematically and in some instances through the presentation of electron micrographs. In this section, each of the three phases will be considered in greater detail.

Phase I - Preparation of the Partial Coating of Diamond on the Substrate

According to preferred applications to the present invention, the application of the partial coating of diamond in the phase 1 or step 1 procedure is conducted by chemical vapor deposition. Preferably the chemical vapor deposition process is conducted utilizing thermal plasma. A thermal plasma stream is one of relatively high pressure (about 50 Torr to about 760 Torr). As a result of the relatively high pressure, the electrons and atoms in the plasma stream are at about the same temperature (thermal equilibrium), typically about 5,000K to about 50,000K. In applications according to the present invention streams about 8,000K to 15,000K will typically be used.

The thermal plasma, from which the chemical vapor phase deposition of the diamond coating is to occur, can be generated in a variety of manners, for example, through RF induction discharge or DC arc discharge. In a typical application, generation is through RF induction discharge, with feedstock comprising hydrogen and methane. Conventional techniques for the generation of thermal plasma involving hydrogen and various carbon feedstocks may be employed.

The substrate to be coated is preferably maintained at a temperature of about 800° to 1200° C., during the deposition process. During the process the substrate is held very close to a very high temperature plasma, and is thus subject to high heat fluxes. Thus, in the application of phase 1 depositions according to the present invention efficient cooling of the substrate will typically be required.

As a result of the relatively high pressure conditions of the thermal plasma stream, the chemical vapor deposition steps of processes according to the present invention occur relatively rapidly. Rates on the order of about 15-60 microns per hour are commonly and readily achieved, and rates up to about 50 microns to 1 millimeter per hour can be achieved. It is anticipated that for industrial applications, rates of at least about 100 microns per hour and typically at least about 100-200 microns per hour will be used.

The process is conducted until the work surface has a coating of appropriate (effective) void area for the application desired. As explained above, typically a coating having coverage of no greater than 95%, i.e. void area of at least about 5%, will be needed. Generally a void area of about 5-30% should be obtained, preferably about 10-20%, for typical applications on tools, cutting blades, drill bits or bearings.

Figure 7:
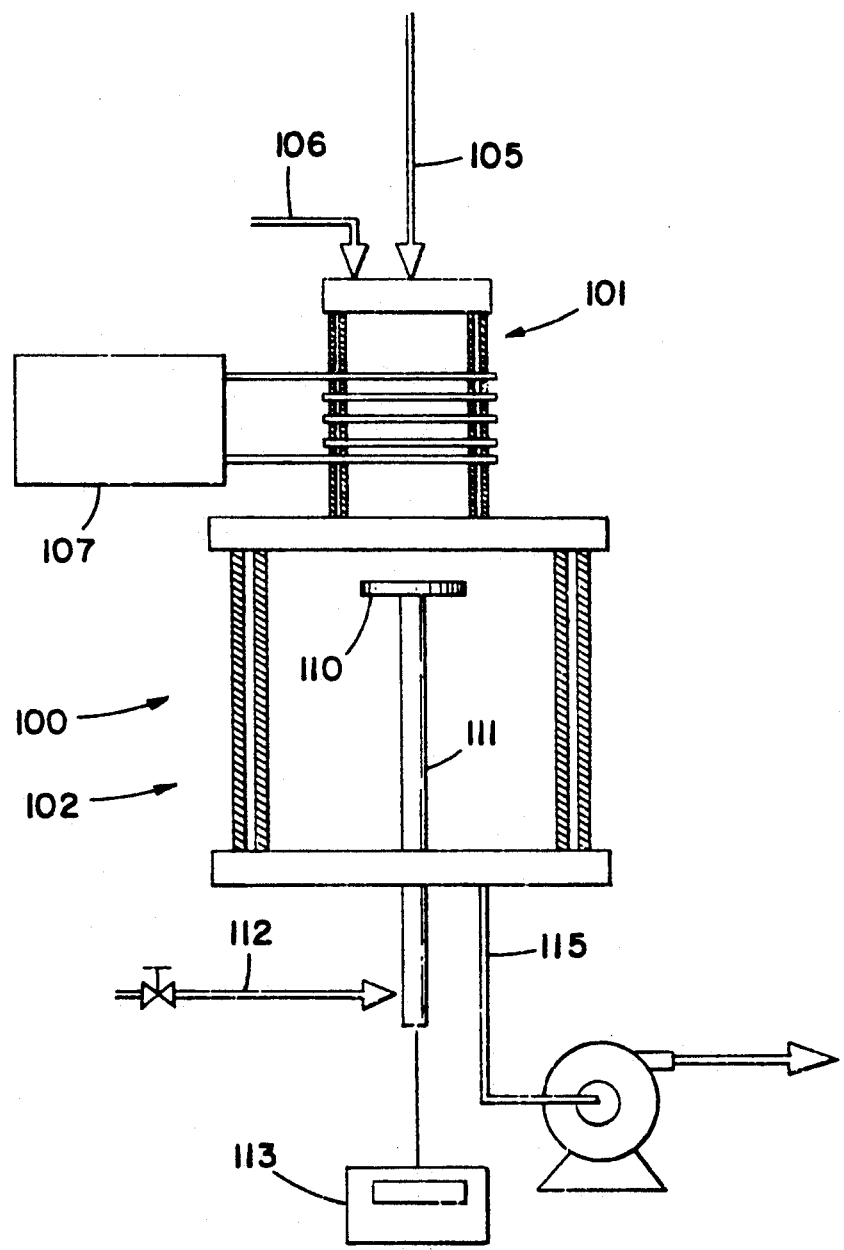
FIG. 7 is a schematic representation of an apparatus used according to the present invention, to apply a diamond coating to a substrate.

In FIG. 7, a schematic view of an apparatus usable to provide chemical vapor deposition of diamond according to the present invention is presented. The apparatus of FIG. 7 is in many ways similar to that described in U.S. Pat. No. 5,032,568, incorporated herein by reference. In Lowe '568 the apparatus was utilized to generate a deposit of superconductive ceramic oxide on a substrate.

Referring to FIG. 7, apparatus 100 is depicted which comprises a plasma generation chamber 101 and a deposition chamber 102. The plasma generation chamber 101 comprises a double walled chamber (preferably two coaxial tubular quartz walls with a cooling arrangement there between). Feeds of argon (carrier gas) and methane (or other carbon source) are indicated at 105. Such a feed is generally made through a central tube, not shown. Hydrogen may be fed with the carbon feedstock at 105. Feed of hydrogen and argon in chamber 101 is indicated at 106. (Of course, if hydrogen is fed with the carbon feedstock it would not necessarily be fed with the sheath gas.) Through application of RF supply 107 high temperature thermal plasma is generated in chamber 101 and is directed therefrom into deposition chamber 102.

Deposition chamber 102 is also provided with two quartz walls, with cooling means therebetween. In chamber 102 a substrate holder 110 is supported upon support construction 111. A substrate to be coated is positioned on substrate holder 110. Construction 111 is provided such that the distance of the substrate holder 110 (and the substrate positioned thereon) from the plasma plume extending outwardly from chamber 101 can be selectively adjusted. In this manner, the nature of deposition of the substrate, and rate of deposition, can be readily adjusted. Construction 111 is provided with means for maintaining the substrate holder 110 cooled, and thus means for cooling the substrate itself (through thermal conduction). In particular, arrangement 111 is provided with a circulating cooling flow from cooling water source 112. A thermocouple (not shown) in the vicinity of holder 110 is utilized to monitor the temperature of the substrate holder 110 and, by correlation, a substrate thereon. The thermocouple is monitored at 113. Alternatively, or in addition, a pyrometer can be used to monitor conditions in chamber 102. At 115 exhaust of material outwardly from chamber 102 is depicted.

In a typical application, the substrate holder 110 is formed from stainless steel or similar material. In general, the substrate to be coated will be applied thereto and secured thereon by any appropriate means for the conditions of deposition, for example through utilization of a high temperature ceramic adhesive. The substrate holder 110 and mechanism 111 may be varied in shape or configuration to appropriately support and cool a variety of substrates of various materials or configurations.

An apparatus such as that shown in FIG. 7, utilized to conduct chemical vapor deposition from thermal plasma at the conditions of pressure within the range of about 50 Torr to 760 Torr, can be used to achieve deposition of a relatively thin diamond coating (i.e. partial coating) in a relatively short period of time, typically no longer than about 20-40 minutes and much shorter if high deposition rates are used. Thus, the typical conduct of the first phase of the process shown in FIG. 1, with a variety of substrates, can be conducted in a relatively short period of time minimizing undesirable over-tempering or over-heating effects in the substrate. As a result, at least phase 1 of the process as described is particularly well adapted for utilization with substrate materials susceptible to over-tempering, such as tool steel.

Phase 2 - Application of Binder

In general, preferred CVD processes applied in methods according to the present invention are described as occurring from thermal plasma. Of course, in the vicinity of the substrate, the plasma characteristics may have changed. Thus, by the characterizations used herein, it is meant that a thermal plasma plume is initially generated, and directed to cause the deposition.

In the second phase of the process illustrated in FIG. 1, binder is applied to fill the void area or spaces in the work surface of the substrate. Since diamond has an extremely low electrical conductivity, it has been determined that a particularly effective technique for applying binder to the voids is through electrodeposition. More specifically, typically a substrate will be chosen which possesses appropriate conductivity relative to diamond, so that electrodeposition will occur on the surface of the substrate in preference to the surface of the diamond coating, if the coating/substrate construction following phase 1 is utilized as a working electrode to be plated in an electrodeposition process.

It is foreseen that in a typical application, the binder to be applied in the "void" will be a metal binder. A particularly convenient binder material is nickel, a metal which can be readily applied through electrodeposition. It is foreseen, however, that a variety of binder materials may be utilized including Co and Cr. In some applications layers of different materials or alloy may be applied as binder, with later heat treatment generating desired properties.

In general, and referring to FIG. 2, the depth of plating (application of binder or filler) should be sufficient to achieve effective rooting of the diamond particles. In general, to achieve constructions having advantages according to the present invention, it is foreseen that the plating or binder depth should be approximately 10-80% (preferably about 65-75%) of the average thickness of the partial coating of the diamond that is on the substrate at the time of the binder deposition. When an electrodeposition process is utilized to apply the binder, rate and depth of plating is readily and quite precisely controlled through control of current and time of electrodeposition. It is foreseen that typically the size or depth of the crystals can be determined in advance of electrodeposition, through correlations with respect to the conditions of the chemical vapor deposition process, for ready control.

Phase 3 - Regrowth

Although preferred processes are described as concerning the application of metal binder through electrodeposition, it is foreseen that in some applications organic binders may be desired.

For the conduct of the third phase, i.e. diamond regrowth, the product resulting from phase 2 application of binder can be resubjected to the conditions of the phase 1 chemical vapor deposition, until completion of the coating is achieved. Thus, the substrate/coating/exposed binder product resulting from phase 2 may be resubjected to diamond deposition in the apparatus of FIG. 7. In this context the term "exposed binder" is meant to refer to the condition wherein the binder has not yet been covered over by further growth of the diamond particles. A particular advantage from the utilization of thermal plasma CVD for the regrowth, is that the conditions will tend to favor some infusion or interdiffusion of the binder with the substrate, providing a more secure coating.

Figure 8:
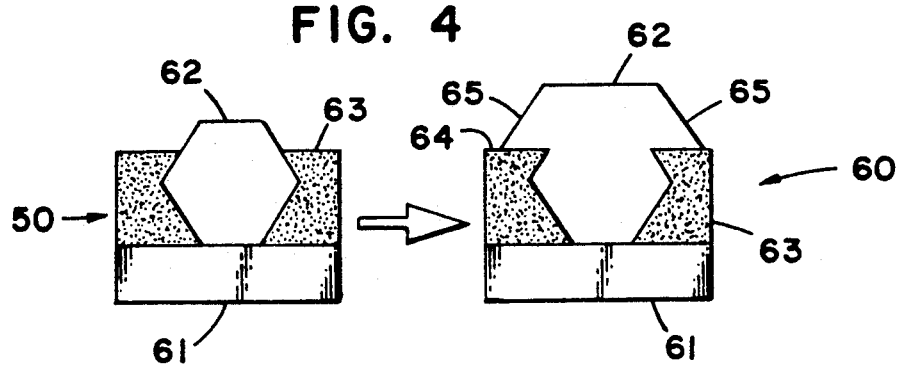
FIG. 8 is a schematic representation illustrating change in the immediate environment of a diamond crystal and coating, during processing according to FIG. 1 between steps or phases 2 and 3.

Attention is directed to FIG. 8, with respect to the regrowth of the diamond crystals. In FIG. 8 a schematic is presented, which reflects the substrate before (at 50) and after (at 60) crystal regrowth. In particular, referring to FIG. 8 substrate 61 is illustrated with diamond crystal 62 applied by chemical vapor deposition. In FIG. 8, at 50, crystal 62 is shown surrounded by binder material 63.

At 60, as a result of regrowth, substrate 61 is shown with crystal 62 thereon, surrounded by binder 63. However, above an outer surface 64 of binder 63, expansion in the crystal, as indicated at 65, has occurred as a result of the regrowth. Thus, binder 63 is no longer as exposed as it was before the regrowth. In general, as explained above, regrowth will be conducted at least until substantially all of binder 63 is covered by diamond crystal. By "substantially all" in this context it is not meant that 100% coverage is necessarily achieved, although it may be sought. Generally, the amount of coverage that can be practically achieved, is what will be pursued.

It has been observed, with regrowth of diamond crystals, that the growth occurs preferentially on exposed diamond surface rather than exposed binder surface and with that portion of diamond crystal extending outwardly from the binder 63 expanding both laterally and in depth. This is advantageous, since the lateral expansion ensures coverage of the previously exposed binder.

Referring to the "post-regrowth" schematic at 60, in FIG. 8, it will be understood that diamond crystal in systems prepared according to the present invention are very well secured to the substrate. They are not only in communication within the substrate (for example through interdiffusion or infusion), but they are also secured within the binder 63. The result of this arrangement is the presentation of unique properties in the resulting diamond coating. Also, because thermal plasma is utilized for the regrowth, again relatively short exposure times of the substrate to the heat occurs, with resultant cost efficiencies and less likelihood of heat damage to the substrate.

The Advantageous Product Resulting From the Process

Products made according to the present invention are unique. They can be generally characterized as comprising diamond crystal applied to a substrate, the crystals having base portions and head portions. The base portions are embedded within non-diamond binder and, the head portions extend over and in covering relationship with respect to the binder.

The presence of the binder, and spaces between diamond crystal base portions and underneath the outside covering or diamond crystal head portions, provides great advantage. Coatings according to the present invention are not very susceptible to cracking or failure upon application of extreme physical shock or thermal shock, since the binder provides for some expansion/contraction, toughness or give, to the coating or system. The head portions of the diamond crystals extending over the binder, protect the binder material from corrosive attack, thus extending likely lifetime or wear time of the coating.

The binder material also assists in providing good adherence of the diamond coating to the substrate. Thus, diamond particles coated onto substrates according to the present invention are relatively secure and are not likely to become dislodged. An experiment with respect to this, is reported hereinbelow.

Figure 9:
FIG. 9 is a scanning electron micrograph of a cross-section of a diamond coating on a substrate made according to the present invention, the coating of FIG. 9 generally corresponding to the schematic of FIG. 4.

Attention is now directed to FIG. 9, with respect to the unique coatings prepared according to the present invention. In FIG. 9 an electron micrograph is depicted, showing a coating in cross-section. In the upper portion of the electron micrograph, two diamond crystals are shown embedded within a layer of binder. The binder is generally indicated region 200. The tungsten substrate, is generally indicated at region 201. In region 203, the band of relatively dark coloration indicates some diffusion of nickel binder into the substrate (and some carborization), as a result of the high temperature condition of the third phase operation conducted. This diffusion of the nickel binder into the substrate (which may well extend even deeper than region 203) will help secure the coating to the substrate. It is noted that some diffusion of substrate into the binder also occurs; i.e., interdiffusion.

Figure 10:
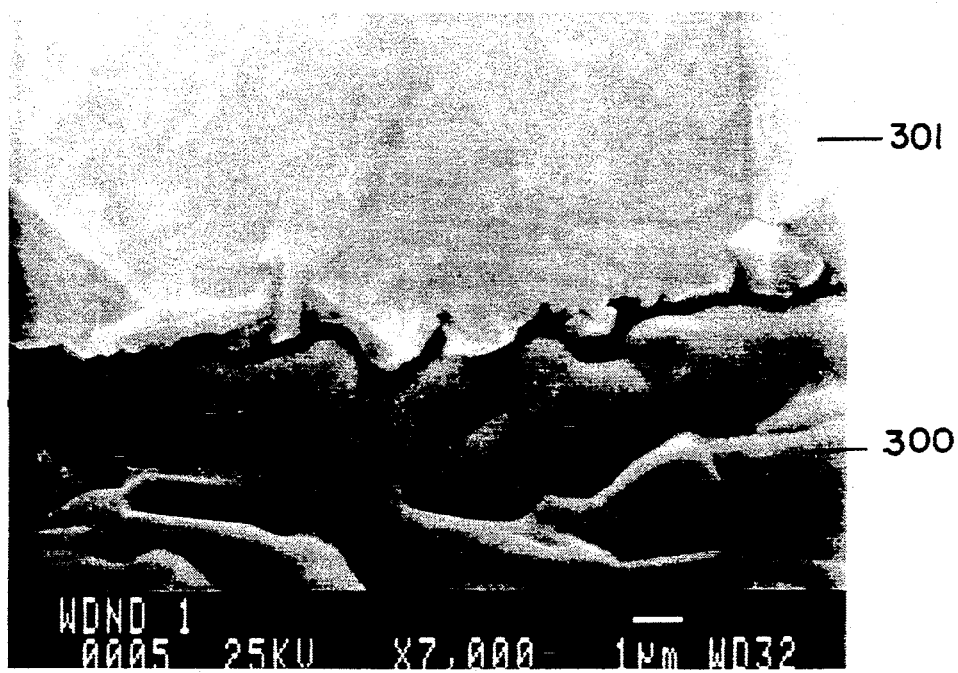
FIG. 10 is a scanning electron micrograph depicting the interphase between a diamond coating and binder in a substrate having a diamond coating thereon made according to the present invention.

Advantage with respect to strength of the coating also results from the manner in which regrowth occurs. In particular, as indicated generally above, regrowth occurs on the surface of our already embedded diamonds, with some growth occurring laterally along the upper surface of the binder. When the binder is a metal binder such as nickel, the surface of the binder may be relatively rough, i.e. have indentations therein. As the diamond grows laterally along such a surface, diamond growth will dip into the indentations in the surface, providing an overall interlocking and thus added strength and hardness to the diamond coating. With respect to this, attention is directed to FIG. 10. In FIG. 10 an electron micrograph is provided, with a scale of 1.0 micron shown. The electron micrograph shows the interface between the diamond coating (light color) and the nickel binder (dark color with indentations). The nickel binder, indicated generally in the region shown at 300, has numerous indentations or rough spots therein. The diamond indicated generally at 301, has grown into such indentations forming a very wear resistant, strong coating of unique properties.

The Nature of the Plasma

The general nature of the plasma stream preferably used in phases 1 and 3 of the present invention was provided above. Herein a more detailed characterization of the plasma stream is provided.

Thermal plasmas are characterized by high electron densities (typically above $10^{22}$ m$^{-3}$) and temperatures between 5,000K and 50,000K. By definition, thermal plasmas are in a Local Thermal Equilibrium (LTE), i.e. they can be characterized by single temperature value except for the radiation field. The two principal advantages of thermal plasmas for material processing are (1) the choice of medium—any material can become a plasma; and, (2) the unique properties associated with a thermal plasmas, namely high energy density (high specific heat), high thermal conductivity, variable electron conductivity, and high emission of radiation.

EXPERIMENTAL EXAMPLES

Experimental Setup

A radio frequency (RF) plasma chemical vapor deposition (CVD) system generally according to FIG. 7 was established. The reaction torch comprised a water cooled quartz plasma confinement tube (55 mm ID) surrounded by a 6 turn RF coil powered by an RF generator with a maximum plate power of 50 kw operated 4 MHz. The sheath gas was injected at an angle of 45° with respect to the vertical axis. An argon stream (with hydrogen therein) was used as the sheath gas to center and stabilize the plasma.

Conditions for Diamond Deposition

For the experiments reported herein, the conditions for diamond deposition within the deposition apparatus were generally as follows:

RF power: (2A×6.4KV at 4MH$_z$) 12.8KW
Sheath gas flow rate: 35 liters per minute (argon)
CH$_4$ flow rate: 0.05 liter per minute
H$_2$ flow rate: 5.0 liters per minute
Process pressure: 300 Torr
Substrate temperature: 900°–1100° C.
Deposition time: 20 minutes to 40 min. for 5–10 micron film.

Substrates were cemented onto the sample holder using a ceramic base high temperature adhesive (904 Zirconia Ultra Hi-Temp Ceramic Cotronics Corp., Brooklyn, N.Y. 11235, such ceramic adhesives are described as effective up to 4,000° F.). During deposition, an extensive heat flux from the plasma to the substrate surface was observed. The substrate holder was cooled from the backside using cooling water.

The reaction chamber was purged with argon. The plasma was started in a pure argon environment at a pressure of about 5 Torr. The argon pressure was increased to about 300 Torr. Hydrogen was then gradually added to the plasma torch and methane was fed through a center feeding probe. After the deposition, the substrate was released from the holder upon peeling away of the adhesive (which became very brittle or friable under the conditions involved). After a typical 20–40 min. run under such conditions, the average particle size was about 15 microns across. With the substrate comprising tungsten or molybdenum (Mo), under such conditions a void area of about 5–30% in the diamond coating was observed.

Experimental Conditions for Binder Application

For the experiments discussed herein, the binder comprised nickel applied through electroplating. In all experiments, it was observed that the plating occurred preferentially in the void, not over the diamond particles. This may be attributed to the very low electrical conductivity of diamond relative to the substrates used.

For typical experiments, the conditions of electroplating or the electrodeposition were as follows:

Plating bath composition: nickel chloride (240 gram per liter);
Boric acid: 30 gram per liter;
Current density: 5–10 A/dm$^2$
Plating time: 20 minutes For a typical application, a beaker of the plating bath was prepared. The diamond coated substrate was immersed in the solution and connected to a potentiostat/galvanostat as the working electrode. A counter electrode was immersed in the solution so that the diamond coated face of the working electrode was facing it. The two electrodes were positioned so that they were parallel to one another but did not touch. The counter electrode could be made of the same material as the substrate of the coated plate or of any inert conductor. For the best results the counter electrode should be of approximately the same surface area as the plated surface. Platinum foil has been used. Commercial plating, which may be utilized, is often done at elevated temperatures (30° to 90° C). However, satisfactory filling by plating at room temperature has been achieved.

Appearance of Coating After Initial Deposition

As indicated above, the average size of the particles was generally about 15 microns, typically within the range of about 10–20 microns across. The crystals were observed to be well faceted. Generally it was observed that a larger number of crystals had the (100) facet or plane facing upward, with a lesser number having the (111) facing outward. Thus, it was observed that there appeared to be a preferential orientation of the crystals with flat surfaces directed upwardly, rather than ridges or edges pointing upward. The amount of this preference was observed to have some interdependence with the temperature of the plasma plume region at which the substrate was exposed to the deposition. Thus, non-random orientation of crystals in the substrate can be effected through adjustment of the location of the substrate support and substrate, in the plasma torch.

Microscratch Test

Scratch tests were performed on a substrate/diamond/ exposed binder construction resulting from conduct to phase 1 and phase 2 of the process illustrated in FIG. 3. In general, the construction comprised a diamond coating of about 10 microns on an Mo substrate with Ni binder.

The general techniques for microscratch testing utilized correspond to those generally described in Wu, T.W., "Microscratch and load relaxation tests for ultrathin films", *J. Mater. Res.*, Vol. 6(2), P. 407–426 (Feb.

1991), incorporated herein by reference. The scratch tests were performed using a nanoindentor to test the adherence of the diamonds, within the binder. An indenter draws a conical diamond tip across the surface being tested, while continuously recording the load and depth of penetration. Scratching of a continuous diamond film would damage the indenter, so the tests were conducted on an arrangement having diamonds dispersed within and spaced from one another by the exposed binder.

Such scratch tests are conducted by translating the indenter simultaneously in the X and Z directions. For each experiment, the indentor is first brought to within 0.2 μm sample surface using the Z axis stepper motors. The PZT (piezoelectric translator) is then activated to drive the indentor toward the sample surface at about 15 μm/sec. After the tip touches the sample surface, the indentor is backed a few nanometers away from the sample surface so that the scratch test can be started at a zero applied load. The travel distance and speed of the X stage are usually set as 100-120 microns and 0.5 microns/second respectively. Once the motion of the X stage is started, the PZT is again activated to drive the indentor into the sample. The load and depth of penetration at each point along the scratch are directly recorded.

The load on the indenter will rise, as the indenter runs into a diamond crystal on the surface. The load drops sharply, if the diamond detaches from the substrate. The peak load is measured if and when the indenter tip hits and knocks off a diamond. This peak load is a qualitative measure of the adhesion strength.

Diamonds deposited on a limited substrate without plating a binder thereto showed critical loads of 0.0025N to 0.025N. On a similar specimen with nickel plating, loads of 0.03N to 0.3N were seen. However, upon inspection, the diamonds did not de-adhere from the surface under those peak loads (0.03N to 0.3N). Rather, it appeared that the indenter tip simply rode over the diamonds. In some instances the diamonds on the surface broke rather than became dislodged or disadhered. This is indicated for example in FIG. 5 discussed above, whereat the chip in the diamond crystal is depicted.

As a result of micro-scratch tests on samples such as those described above, it was concluded that the plasma deposition process utilized, with the intermediate step of metal binder application, increases the adherence of the diamonds to the substrate relative to conventional methods. This is indicated by the fact that the diamond will break (FIG. 5) under the scratch test, rather than become separated from the surface of the construction.

Wear Test

The general techniques utilized for wear testing are described in Sarkar, A.D., *Friction and Wear*, Academic Press, 1980, p. 2-4; and, Sarkar, A.D. "Wear of Metals" Pergamon, Oxford (1976); both of which are incorporated herein by reference. Pin on disk test using 440-C. stainless steel pins (4.8 mm dia.) (hardness=55-60 Rc) or tungsten indicate that the metal binder significantly improves the wear resistance of the diamond film. The loads were varied from 2-8 lbs. (8.9N to 35.6N). Rotational rates of 100-500 rpm were used. Weaker films de-adhered almost immediately at the beginning of the test, stripping both diamond and binder from the contact area. These weaker films were characterized by a lack of binder (i.e. 1st phase only) or widely dispersed diamonds. The presence of Ni binder and greater surface density of diamond crystals (>90% coverage) combine to provide the most adherent films. In one sample, after 100,000 cycles under a four pound (17.8N) load, Ni-plated diamonds (after phase 2 of the process illustrated in FIG. 1) on an Mo substrate showed no signs of de-adhesion. On the other hand, a non-plated area of the same Mo substrate sample was subjected to the wear test and it was observed that some of the diamonds had been removed or dislodged by the abrasive action of the pin. Three-step films (films after phase 3) on tungsten substrates exhibited very good adherence, lasting up to 40,000 cycles with an 8 lb. (35.6N) load on a tungsten pin.

What is claimed and desired to be secured for letters patent is as follows:

1. A diamond coated product comprising:
(a) a substrate having a work surface thereon;
(b) a diamond coating positioned on said substrate work surface; said diamond coating comprising diamond crystal material having base portions in communication with said substrate; said diamond crystal material base portions having spaces therebetween; and,
(c) binder material in said spaces between said diamond crystal material base portions; said binder material having an outer surface spaced from said substrate;
   (i) said diamond crystal material including a head portion extending in continuous covering relation over said binder material outer surface.

2. A product according to claim 1 wherein said substrate comprises tool steel.

3. A product according to claim 1 wherein said binder material is between about 3 and 15 microns thick.

4. A product according to claim 1 wherein said binder material comprises nickel.

5. A product according to claim 1 wherein said diamond material head portion is between about 2 and 7 microns thick.

6. A product according to claim 1 wherein:
(a) said substrate comprises tool steel;
(b) said binder comprises nickel and occupies between about 5% and about 30% of the area of the substrate work surface; and,
(c) said diamond material head portion is between about 2 and 7 microns thick.

7. A diamond coating prepared according to a method including the steps of:
(a) applying a partial diamond coating to a work surface of a substrate and leaving an effective amount of void area on the work surface, not covered by diamond coating, for receipt of binder to secure the partial diamond coating;
(b) covering the void area in the partial diamond coating with binder; and,
(c) following the step of covering the void area with binder, growing a continuous diamond coating over the binder to cover the binder.

8. A diamond coating prepared according to a method including the steps of:
(a) applying a partial diamond coating, to a work surface of a substrate and leaving an effective amount of void area on the work surface, not covered by diamond coating, for receipt of binder to secure the partial diamond coating;
   (i) said step of applying a partial diamond coating comprising applying a coating having a first average thickness; and, (ii) said step of applying a partial diamond coating comprising chemical vapor deposition of diamond from a thermal plasma plume;

(b) filling the void area on the work surface and the partial diamond coating with binder;

(i) said step of filling the void area with binder comprising filling the void area with a binder depth of between about 10% and about 80% of the first average thickness; and, (ii) said step of filling void area with binder further comprising electrodeposition of metal binder in the void; and, (c) growing further diamond coating over the binder to form a continuous diamond coating over the binder;

(i) said step of growing further diamond coating over the binder comprising a step of chemical vapor deposition of diamond from a thermal plasma plume, to expand diamond crystals in the partial diamond coating.

* * * * *